United States Patent [19]

Person

[11] Patent Number: 4,969,511
[45] Date of Patent: Nov. 13, 1990

[54] SUBSTRATE THERMAL INTERFACE EMPLOYING HELIUM GAP

[76] Inventor: George A. Person, 3807 North 28th St., Phoenix, Ariz. 85016

[21] Appl. No.: 375,160

[22] Filed: Jul. 3, 1989

[51] Int. Cl.$^5$ .............................................. F28F 13/00
[52] U.S. Cl. ................................. 165/80.4; 165/80.2; 165/104.34; 165/185; 165/903
[58] Field of Search .................. 165/104.34, 185, 903, 165/80.2, 80.4, 80.5

[56] References Cited

U.S. PATENT DOCUMENTS

| | | | |
|---|---|---|---|
| 4,069,864 | 1/1978 | Novoryta et al. .................. | 165/185 |
| 4,449,580 | 5/1984 | Reisman et al. ................. | 165/104.34 |
| 4,508,161 | 4/1985 | Holden ............................. | 165/185 |

*Primary Examiner*—Albert W. Davis, Jr.

[57] ABSTRACT

A method and exemplary apparatus are disclosed for increasing the heat transfer capabilities between a nominally planar, but actually slightly concave, first surface (such as the substrate of a micropackage) and a planar second surface such as a heat sink. This result is obtained by filling any non-contacting space intermediate the heat transfer surfaces of the thermal interface with helium. In a test environment for a micropackage, the heat transferring surfaces are, respectively, a substrate outer face of the micropackage and a planar surface of a test fixture heatsink. Helium is introduced, under pressure, through one or more apertures provided in the heatsink planar surface to displace air and occupy any non-contacting space between the heat transferring surface which result from the presence of non-planar regions of the substrate outer face, particularly those resulting from quasi-spherical surface distortion. Such quasi-spherical surface distortion is often observed in micropackages and is typically in the form of a generally slightly concave surface configuration caused by stresses applied to the inner face of the substrate by the overlaying circuit laminations. In one embodiment of the invention, the helium is supplied at sufficient pressure to ensure a constant leak of helium to the ambient at the periphery of the thermal interface ot further promote temperature uniformity by convection as well as by the superior heat transfer characteristics of helium over air.

2 Claims, 2 Drawing Sheets

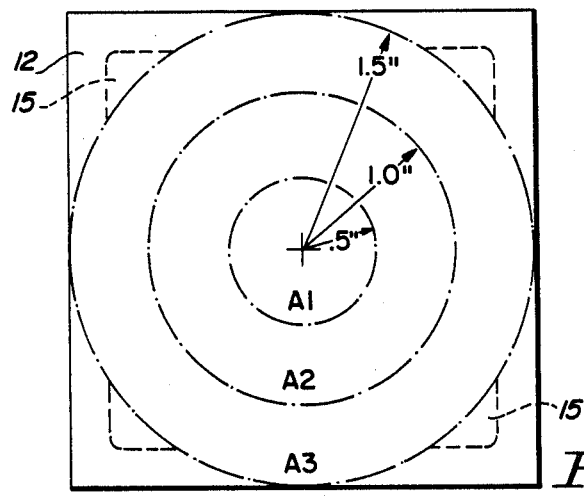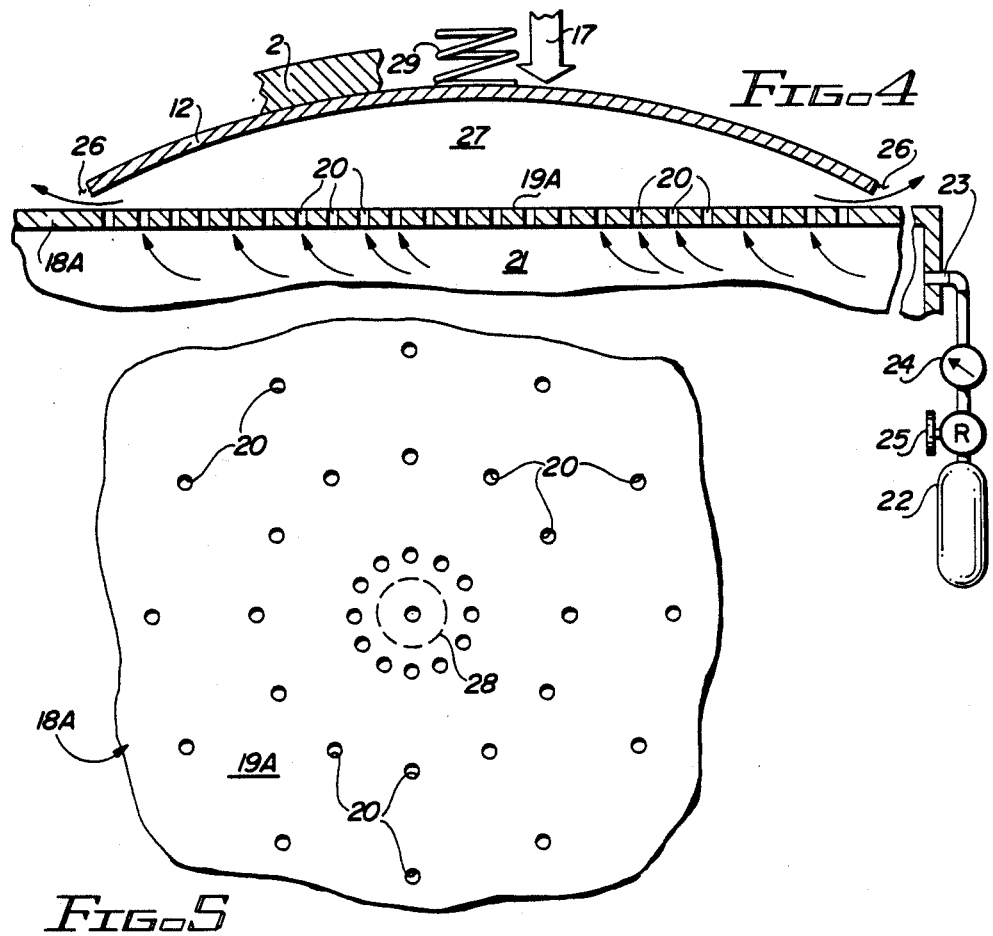

SUBSTRATE THERMAL INTERFACE EMPLOYING HELIUM GAP

FIELD OF THE INVENTION

This invention relates to the art of thermal transfer and, more particularly, to a method and apparatus in a test fixture for increasing heat transfer from an electronic circuit micropackage substrate to a heatsink.

BACKGROUND OF THE INVENTION

In the mechanical realization of some electronic circuits, such as those employed in large scale digital computers, significant quantities of circuitry may be packaged together in a module known in the art as a micropackage. Within a typical micropackage, one surface of a good thermally conductive (such as alumina) substrate supports multiple layers of circuit paths, and a top layer receives one or more integrated circuits interconnected to perform the electronic office of the module. The module is energized by contacts bearing against certain areas of the module cover structure, and interconnection to other modules is accomplished through numerous contact areas peripherally distributed about the edges of the module. Those skilled in the art will understand that the module is sealed against contamination from the environment of use and that cooling is effected by heat transfer from the integrated circuits across the circuit layers to the substrate whose outer face forms one major surface of the module. During module operation, this outer face is placed into heat transfer relationship to a heat sink system. In normal operation within an operating digital computer or the like, the heat sink system typically includes a flexible copper diaphragm which lays against the outer substrate face, the other side of the diaphragm being bathed by circulating cooling fluid such as water. The cooling fluid is maintained at above atmospheric pressure such that the diaphragm conforms to any slight non-planar regions of the surface area of the outer face of the substrate, thus ensuring good thermal transfer from the substrate to the circulating fluid. In a well-designed electronic system employing such micropackages and such a cooling technique, densely populated, heat generating micropackages may operate trouble free for many years because of the effectiveness of the cooling methodology.

At the end of their fabrication, each micropackage must be thoroughly tested individually to ensure that it fully meets its operating specifications. In addition, it is desirable to similarly test micropackages which have failed in the field to determine the reason for its failure. These tests are carried out by mounting a given module in a test fixture and using a special purpose tester which can exercise the module through all its states and log the results. Typically, the test fixture incorporates a massive heatsink to simulate the normal operation cooling system described above, the outer face of the substrate bearing against a planar surface of the heatsink.

In the performance of these tests, an unexpected and potentially destructive heat transfer condition has been encountered. Generally, the problem has been observed as a substantial difference between the temperature of the substrate in the center area as opposed to the temperature around its periphery, the former being much higher. Those skilled in the art will recognize that this condition indicates a decidedly non-uniform heat transfer condition between the substrate and the planar surface of the heatsink. In order both to protect a micropackage under test from damage or destruction from localized overheating and to ensure valid test results, it is highly desirable that the heat transfer between the outer face of the micropackage substrate and the planar surface of the heat sink be as uniform across the interface as possible, and it is to that end that this invention is directed.

OBJECTS OF THE INVENTION

It is therefore a broad object of this invention to provide an improved heat transfer interface between a heat transferring surface to a heat receiving surface.

It is another object of this invention to provide a method, and apparatus for practicing the method, for improving the heat transfer characteristic of an interface including closely spaced heat transfer surfaces.

In a more specific aspect, it is an object of this invention to provide a test fixture cooling environment for a micropackage which promotes uniformity of temperature at a thermal interface between the micropackage and the test fixture when the physical interface of closely spaced surfaces is dimensionally non-uniform.

SUMMARY OF THE INVENTION

Briefly, these and other objects of the invention are achieved by filling any non-contacting space intermediate nominally contacting heat transfer surfaces at a thermal interface with helium. In a test environment for a micropackage, the heat transferring surfaces are, respectively, a substrate outer face of the micropackage and a planar surface of a test fixture heatsink. Helium is introduced, under pressure, through one or more apertures provided in the heatsink planar surface to displace air and occupy any non-contacting space between the heat transferring surfaces which result from the presence of non-planar regions of the substrate outer face, particularly those resulting from quasi-spherical surface distortion. Such quasi-spherical surface distortion is often observed and is typically in the form of a generally slightly concave surface configuration caused by stresses applied to the inner face of the substrate by the overlaying circuit laminations. In one embodiment of the invention, the helium is supplied at sufficient pressure to ensure a constant leak of helium to the ambient at the periphery of the thermal interface to further promote temperature uniformity by convection as well as by the superior heat transfer characteristics of helium over air.

DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the subjoined claims and the accompanying drawing of which:

FIGS. 3A and 3B are, respectively, greatly exaggerated graphical and topographical representations of a typical micropackage substrate distortion;

FIG. 4 illustrates a test fixture according to the present invention by the use of which substantially uniform cooling for the distorted micropackage substrate may be obtained; and FIG. 5 illustrates an exemplary distribution pattern for an array of apertures provided in a planar surface of the test fixture for discharging helium in accordance with the invention.

DETAILED DESCRIPTION OF THE INVENTION

Figure 1:
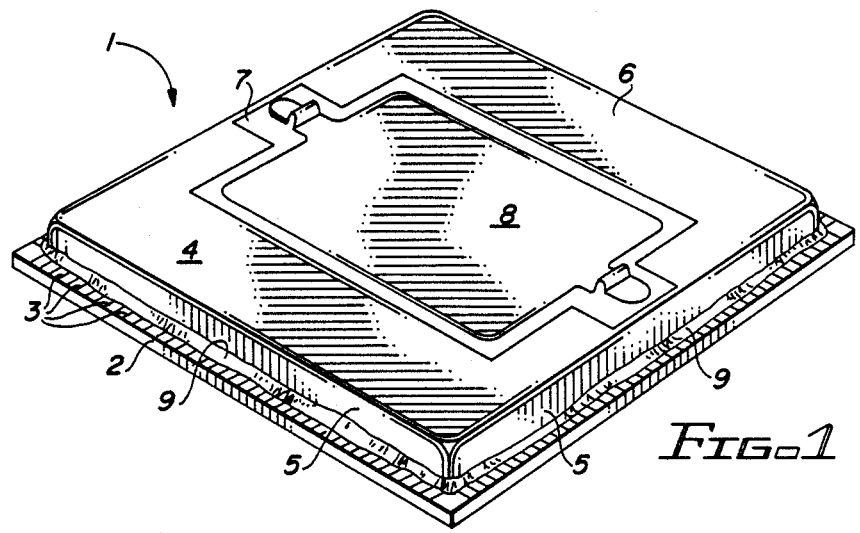
FIG. 1 is a perspective view of an integrated circuit assembly constituting an exemplary micropackage, in the testing of which the subject invention finds use.

FIG. 1 illustrates an exemplary electronics module or micropackage 1, containing a very extensive amount of integrated circuitry on and within a multilayer printed circuit board supported on an alumina substrate 2 which carries a large number of signal contact pads 3 about its periphery. Power is supplied to the module 1 through a conductive cover member 4 which also serves to seal the circuitry contained within the package 1 against environmental contamination. The conductive cover member 4 has downwardly extending risers 5 on all four sides (with their adjoining edges welded or otherwise sealed) and a conductive upper surface 6. An insulating pad 7 underlays a generally centrally disposed conductive pad 8 which serves, in conjunction with the conductive upper surface 6, to transfer system power to the micropackage 1 from external contacts (not shown). The cover member 4 is affixed to the circuit board 2 around the entire length of the bottom edges of the risers 5 at a peripheral solder trace 9 which is disposed just inboard the signal contact pads 3. The peripheral solder trace 9 serves as the ground return electrode for the entire circuitry disposed within the micropackage 1.

Figure 2:
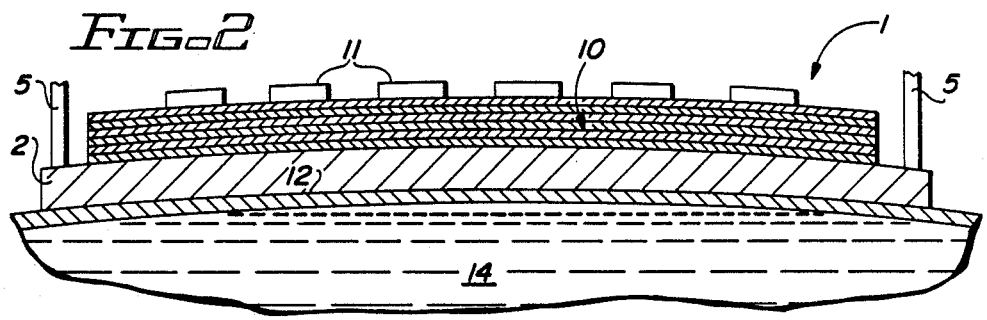
FIG. 2 is a dimensionally distorted partial cross sectional view of the exemplary micropackage placed in a normal use environment.

Attention is now directed to FIG. 2 which illustrates the exemplary micropackage 1 emplaced in its normal operational environment. It will be observed that the interior of the micropackage 1 contains a multilayer circuit board 10, the upper lamina of which also supports a plurality of integrated circuits 11. While the outer face 12 of the substrate 2 is nominally planar, it has been found that the buildup of the laminations of the multilayer circuit board 10 and affixing the integrated circuits 11 introduce a permanent stress onto the substrate that causes the outer face 12 to be slightly concave as shown considerably exaggerated in FIG. 2. This is not a problem in normal operation in which cooling is obtained by heat exchange between the outer face 12 of the substrate 2 and a flexible copper diaphragm 13 which, in turn, transfers heat to a pressurized circulating fluid (such as chilled water) 14 on the other side of the diaphragm 13, all as is well known in the art. Any concavity of the outer face 12 of the substrate 2 is nicely conformed to by the copper diaphragm 13 as a result of the force exerted on it by the pressurized cooling fluid 14.

Figure 3A:
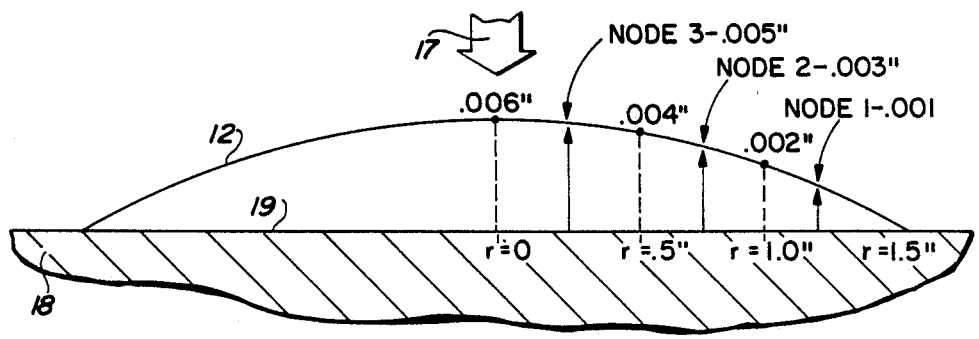

The nature of the distortion of the substrate 2 which creates the concave configuration of its outer face 12 is somewhat variable, but may be generally considered as "quasi-spherical"; i.e., the outer face 12 is typically shaped as an imperfect spherical section with a high point in the central region and the periphery being lower. Thus, referring to FIGS. 3A and 3B, and assuming a micropackage having a square substrate three inches along each edge, the outer face 12 is typically found to be "dished" to about the dimensions shown in FIG. 3A (which is very greatly exaggerated in the vertical dimension for purposes of illustration). More particularly, the maximum inward deflection is at or near the center and is on the order of 0.006 inch. At a radius from the center of about ½ inch, the deflection is found to be about 0.004 inch, and at about one inch, 0.001 inch. As shown in FIG. 3B, the topography is more or less circular at a given deflection although, in the case of a square substrate, the outer topographical lines become more distorted, as indicated by the dashed lines 15 of the outermost topographical line 16, in the region of the corners of the outer face 12. Again, in normal operation, this concavity is not a problem since the heat receiving diaphragm abuts the outer face 12 with a conforming convexity.

However, as previously mentioned, it is sometimes necessary to operate a micropackage in a test fixture. Still referring to FIG. 3A, the classical mechanism for cooling a micropackage under independent test out of its normal operating environment is to press it against a heat sink 18, part of the test fixture, by exerting a continuous downward force represented by the arrow 17. If only a slight downward force is applied, the temperature in the central region of the outer face 12 of the substrate is found to function at around 37° Centigrade higher than in the peripheral region in direct contact with the heat sink 18 for a micropackage consuming about forty-three watts of electrical energy. Those skilled in the art will immediately understand from this information that this subtle problem can be significant and even dangerous to the micropackage under test.

It has been found that the highest point of the outer face 12 over the upper surface 19 of the heat sink 18 can be reduced by about 0.001 inch to 0.005 inch if the force represented by the arrow 17 is centrally placed and increased to about seventy pounds. This procedure reduces the difference in the temperatures observed in the central and peripheral regions of the substrate about 5° Centigrade. The amount obtained toward equalization, although helpful, is inadequate to solve the problem, and any further increased downward force could itself become a problem leading to possible fracture of the circuit structure.

Referring now to FIGS. 4 and 5, there is shown a modified heatsink 18A component of the test jig by the use of which, in conjunction with a supply of helium under pressure above atmospheric to displace air, the temperatures observed at the central region of the substrate of a micropackage under test are very nearly equalized with the temperatures observed at its periphery. In any event, the temperature differential is brought down to a completely safe level. The upper wall of the heatsink 18A is perforated by a plurality of apertures 20 which places the space between the 27 upper surface 19A and the outer face 12 of the substrate 2 into fluid communication with an interior chamber 21 of the heatsink. The interior chamber is, in turn, coupled to a source 22 of helium under pressure by tubing 23. The fluid circuit preferably includes gauge 24 and regulator 25 to control the pressure of the helium within the chamber 21.

In operation during a test procedure, the micropackage is forced downwardly (as by representative compression spring 29) toward the heatsink 18A as again indicated by arrow 17. Helium is then introduced into the chamber 21 and through the apertures 20 to discharge into the space 27 intermediate the outer face 12 of the substrate 2 and the upper surface 19A of the heatsink. The pressure of the supplied helium is adjusted to be sufficient to cause at least a small amount of leakage about the periphery of the substrate 2 as represented by the small separation indicated in FIG. 4 at 26. In this manner, air in the space 27 is positively replaced by helium with its much higher heat conductivity characteristic.

This technique alone results in the reduction of the previously observed temperature difference between the central and peripheral regions of the substrate 2 from about 37° C. to less than 10° C. which is well within acceptable and safe bounds. Further reduction in the temperature difference, if sought for good reason, may be obtained by increasing the downward force represented by the arrow 17 to the maximum permissible (thus decreasing the maximum gap brought about by the concavity) and/or by increasing the pressure of the helium introduced into the chamber 21 to increase the flow of helium to an extent that convection of heat via the gas discharged at the regions 26 becomes a meaningful factor.

It is desirable that the apertures 20 be more or less uniformly distributed across the central upper surface 19A of heat sink 18A. A grid pattern may be employed or, as illustrated in FIG. 5, a circular pattern. Alternatively, a single, larger centrally positioned aperture 28, shown in phantom in FIG. 5, may be employed.

Thus, while the principles of the invention have now been made clear in an illustrative embodiment, there will be immediately obvious to those skilled in the art many modifications of structure, arrangements, proportions, the elements, materials, and components, used in the practice of the invention which are particularly adapted for specific environments and operating requirements without departing from those principles.

What is claimed is:

1. A method for increasing the heat transfer efficiency across a thermal interface between a first surface which is slightly concave and a nominally abutting second surface which is planar, the method comprising the steps of:
   (A) biasing the first surface toward the second surface; and
   (B) introducing and maintaining, through at least one aperture in the second surface, helium at a pressure above atmospheric into the space between the first and second surfaces to displace any air resident therebetween, the pressure of the helium being maintained sufficiently high as to achieve convection cooling brought about by leakage of the helium to the atmosphere at the periphery of the first surface in addition to the heat transfer improvement between the first and second surfaces resulting from the higher thermal conductivity of helium over air.

2. A system for cooling an assembly employing a nominally planar, but actually slightly concave, heat transfer surface, said system comprising:
   (A) a source of helium under pressure;
   (B) a heatsink structure having a planar surface adapted for receiving the heat transfer surface in face to face relationship to establish a heat transfer interface therebetween, said heatsink structure including an interior chamber in fluid communication with said source of helium under pressure;
   (C) at least one aperture extending through said planar surface and opening into said chamber;
   (D) helium supply means placing said chamber into fluid communication with said source of helium under pressure;
   (E) bias means urging the heat transfer surface and said planar surface together; and
   (F) means for regulating the pressure supplied by said source to overcome said bias means sufficiently to permit helium introduced between the heat transfer surface and said planar surface through said aperture to continuously escape beneath the periphery of the heat transfer surface whereby, helium displaces air from the space intermediate the heat transfer surface and said planar surface and continuously flows through the space to cool the heat transfer surface both by conduction through the helium and convection as heated helium escapes to the atmosphere.

* * * * *